(12) United States Patent
Itkin

(10) Patent No.: US 11,002,844 B2
(45) Date of Patent: May 11, 2021

(54) RADAR SYSTEM WITH INTERNAL RAMP LINEARITY MEASUREMENT CAPABILITY

(71) Applicant: Infineon Technologies AG, Neubiberg (DE)

(72) Inventor: Grigory Itkin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 224 days.

(21) Appl. No.: 16/184,699

(22) Filed: Nov. 8, 2018

(65) Prior Publication Data
US 2020/0150258 A1 May 14, 2020

(51) Int. Cl.
| | |
|---|---|
| *G01S 13/34* | (2006.01) |
| *H03L 7/099* | (2006.01) |
| *H03L 7/093* | (2006.01) |
| *G01S 7/35* | (2006.01) |

(52) U.S. Cl.
CPC ............ *G01S 13/343* (2013.01); *G01S 7/352* (2013.01); *H03L 7/093* (2013.01); *H03L 7/099* (2013.01)

(58) Field of Classification Search
CPC combination set(s) only.
See application file for complete search history.

(56) References Cited

U.S. PATENT DOCUMENTS

| 5,379,001 | A | * | 1/1995 | Hedtke | ................. | H03B 23/00 |
|---|---|---|---|---|---|---|
| | | | | | | 331/178 |
| 8,072,277 | B1 | * | 12/2011 | Li | ........................ | H03L 7/197 |
| | | | | | | 331/78 |
| 10,097,287 | B1 | * | 10/2018 | Schat | ..................... | H04B 17/19 |
| 2012/0112806 | A1 | * | 5/2012 | Dayi | ........................ | H03L 7/23 |
| | | | | | | 327/145 |
| 2017/0023670 | A1 | * | 1/2017 | Jansen | .................. | G01S 13/347 |
| 2019/0089368 | A1 | * | 3/2019 | Mo | ........................ | H03M 3/394 |
| 2019/0128998 | A1 | * | 5/2019 | Josefsberg | ............. | H03L 7/091 |
| 2019/0178983 | A1 | * | 6/2019 | Lin | ........................ | H01Q 3/267 |
| 2020/0076440 | A1 | * | 3/2020 | Ng | ........................ | H03L 7/23 |

* cited by examiner

*Primary Examiner* — Mamadou L Diallo
(74) *Attorney, Agent, or Firm* — Murphy, Bilak & Homiller, PLLC

(57) ABSTRACT

A phase-locked loop (PLL) for a radar system includes an oscillator configured to have an output frequency and a multi-modulus divider (MMD) configured to implement successive frequency modulation ramps of the oscillator output frequency, each frequency modulation ramp beginning at a first frequency and ending at a second frequency. The PLL is operated by downmixing an output of the MMD to a frequency above zero Hertz, measuring the downmixed output of the MMD to generate a plurality of MMD output measurements for each frequency modulation ramp, and calculating the frequency of the MMD based on the plurality of MMD output measurements for each frequency modulation ramp.

25 Claims, 15 Drawing Sheets

RADAR SYSTEM WITH INTERNAL RAMP LINEARITY MEASUREMENT CAPABILITY

BACKGROUND

Radar applications use a phase-locked loop (PLL) to generate high frequency ramps over a specified frequency range. To guarantee the PLL ramping parameters, ramping linearity parameters must be controlled and errors must be compensated in case of a detected nonlinearity. Ramping linearity is conventionally measured in the lab during the design and verification phases, and guaranteed for a particular design over the entire product life.

Hence, there is a need for an internal mechanism for measuring ramp linearity and/or correcting ramp nonlinearity in radar systems which use a PLL.

SUMMARY

According to an embodiment of a method of operating a phase-locked loop (PLL) which includes an oscillator configured to have an output frequency and a multi-modulus divider (MMD) configured to implement successive frequency modulation ramps of the oscillator output frequency, each frequency modulation ramp beginning at a first frequency and ending at a second frequency, the method comprising: downmixing an output of the MMD to a frequency above zero Hertz; measuring the downmixed output of the MMD to generate a plurality of MMD output measurements for each frequency modulation ramp; and calculating the frequency of the MMD based on the plurality of MMD output measurements for each frequency modulation ramp.

The frequency at which the downmixed output of the MMD is measured may be derived from a reference clock signal used to control a phase frequency detector of the PLL.

Separately or in combination, the method further comprises shifting the frequency of the reference clock signal to generate the frequency at which the downmixed output of the MMD is measured.

Separately or in combination, shifting the frequency of the reference clock signal to generate the frequency at which the downmixed output of the MMD is measured may comprise: dividing the reference clock signal by a known fixed or variable coefficient to generate a divided reference clock signal; and mixing the reference clock signal with the divided reference clock signal.

Separately or in combination, downmixing the output of the MMD may comprise downmixing SIN and COS components of the reference clock signal with SIN and COS components of the MMD output using a first single side band mixer.

Separately or in combination, the method may further comprise before the downmixing, shifting the frequency of the SIN and COS components of the reference clock signal using a second single side band mixer.

Separately or in combination, the method may further comprise downmixing the SIN and COS components of the reference clock signal with the SIN and COS components of the MMD output without additional shifting of the frequency of the SIN and COS components of the reference clock signal, using a third single side band mixer, wherein the frequency of the MMD is calculated based on measurement values taken at the output of at least one of the second and the third side band mixers.

Separately or in combination, the method may further comprise: ignoring the measurement values taken at the output of the second side band mixer if the frequency of the output of the second side band mixer is at or near zero; and ignoring the measurement values taken at the output of the third side band mixer if the frequency of the output of the third side band mixer is at or near zero.

Separately or in combination, the method may further comprise determining whether the PLL is in a locked condition or an unlocked condition based on the plurality of MMD output measurements for each frequency modulation ramp.

Separately or in combination, the PLL may be determined to be in the locked condition during a frequency modulation ramp if one or more of the MMD output measurements generated for the frequency modulation ramp have a frequency within a predetermined frequency range.

Separately or in combination, the method may further comprise determining at which point of a frequency modulation ramp the PLL enters a locked condition based on the MMD output measurements.

Separately or in combination, the method may further comprise correcting ramp nonlinearity based on the MMD output measurements.

Separately or in combination, the method may further comprise correcting a received signal based on the MMD output measurements.

Separately or in combination, the received signal may be corrected based on the MMD output measurements directly after down-conversion in the analogue domain, after sampling in the digital domain, or after conversion to the frequency domain.

According to an embodiment of a phase-locked loop (PLL), the PLL comprises: an oscillator configured to have an output frequency; a multi-modulus divider (MMD) configured to implement successive frequency modulation ramps of the oscillator output frequency, each frequency modulation ramp beginning at a first frequency and ending at a second frequency; a first down-mixer configured to downmix an output of the MMD to a frequency above zero Hertz; a measurement unit configured to measure the downmixed output of the MMD to generate a plurality of MMD output measurements for each frequency modulation ramp; and a calculation unit configured to calculate the frequency of the MMD based on the plurality of MMD output measurements for each frequency modulation ramp.

The frequency at which the downmixed output of the MMD is measured may be derived from a reference clock signal used to control a phase frequency detector of the PLL.

Separately or in combination, the PLL may further comprise a frequency shifter configured to shift the frequency of the reference clock signal to generate the frequency at which the downmixed output of the MMD is measured.

Separately or in combination, the frequency shifter may comprise: a frequency divider configured to divide the reference clock signal by a known fixed or variable coefficient to generate a divided reference clock signal; and a mixer configured to mix the reference clock signal with the divided reference clock signal.

Separately or in combination, the frequency shifter may comprise a first single side band mixer configured to downmix SIN and COS components of the reference clock signal with SIN and COS components of the MMD output.

Separately or in combination, the frequency shifter may further comprise a second single side band mixer configured to shift the frequency of the SIN and COS components of the reference clock signal before downmixing the SIN and COS components of the reference clock signal with the SIN and COS components of the MMD output.

Separately or in combination, the frequency shifter may further comprise a third single side band mixer configured to downmix the SIN and COS components of the reference clock signal with the SIN and COS components of the MMD output without additional shifting of the frequency of the SIN and COS components of the reference clock signal, and the calculation unit may be configured to calculate the frequency of the MMD based on measurement values taken at the output of at least one of the second and the third side band mixers.

Separately or in combination, the calculation unit may be further configured to: ignore the measurement values taken at the output of the second side band mixer if the frequency of the output of the second side band mixer is at or near zero; and ignore the measurement values taken at the output of the third side band mixer if the frequency of the output of the third side band mixer is at or near zero.

Separately or in combination, the PLL may further comprise a digital lock detection unit configured to determine whether the PLL is in a locked condition or an unlocked condition based on the plurality of MMD output measurements for each frequency modulation ramp.

Separately or in combination, the digital lock detection unit may be configured to determine the PLL is in a locked condition during a frequency modulation ramp if one or more of the MMD output measurements generated for the frequency modulation ramp have an amplitude corresponding to frequency variations within a predetermined kilohertz frequency range.

Separately or in combination, the digital lock detection unit may be further configured to determine at which point of a frequency modulation ramp the PLL enters a locked condition based on the MMD output measurements.

Separately or in combination, the digital lock detection unit may be further configured to correct ramp nonlinearity based on the MMD output measurements.

Separately or in combination, the PLL may further comprise a correction unit configured to correct a received signal based on the MMD output measurements.

Separately or in combination, the correction unit may be configured to correct the received signal based on the MMD output measurements directly after down-conversion in the analogue domain, or the correction unit may be a digital signal processor configured to correct the received signal based on the MMD output measurements after sampling in the digital domain or after conversion to the frequency domain.

According to an embodiment of a radar system, the radar system comprises: a signal generator configured to generate a frequency-modulated continuous-wave signal; a power amplifier configured to amplify the frequency-modulated continuous-wave signal for transmission; an antenna to radiate transmitter signal; an antenna to receive a return signal; a receiver configured to receive a return signal; and a digital signal processor configured to process the received signal and control the signal generator. The signal generator comprises a phase-locked loop (PLL) which includes: an oscillator configured to set the frequency of the frequency-modulated continuous-wave signal; a multi-modulus divider (MMD) configured to implement successive frequency modulation ramps of the oscillator frequency, each frequency modulation ramp beginning at a first frequency and ending at a second frequency; a first down-mixer configured to downmix an output of the MMD to a frequency above zero Hertz; a measurement unit configured to measure the downmixed output of the MMD to generate a plurality of MMD output measurements for each frequency modulation ramp; and a calculation unit configured to calculate the frequency of the MMD based on the plurality of MMD output measurements for each frequency modulation ramp.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a radar system which has an internal mechanism for measuring oscillator ramp linearity and/or correcting oscillator ramp nonlinearity. The PLL includes an oscillator such as an RF VCO having an output frequency and a multi-modulus divider (MMD) for implementing successive frequency modulation ramps of the oscillator output frequency. In PLL locked conditions, the output frequency of the MMD is constant and equal or nearly equal (i.e. within some locking tolerance) to the reference frequency provided to the phase-frequency detector (PFD) of the PLL.

Ramp linearity is measured by downmixing the output of the MMD to a frequency above zero Hertz, measuring the downmixed output of the MMD to generate MMD output measurements for each frequency modulation ramp, and calculating the frequency of the MMD based on the MMD output measurements for each frequency modulation ramp. Ramp nonlinearity may be corrected based on the MMD output measurements. Separately or in combination, a signal received by the radar system may be corrected based on the MMD output measurements.

Figure 1:
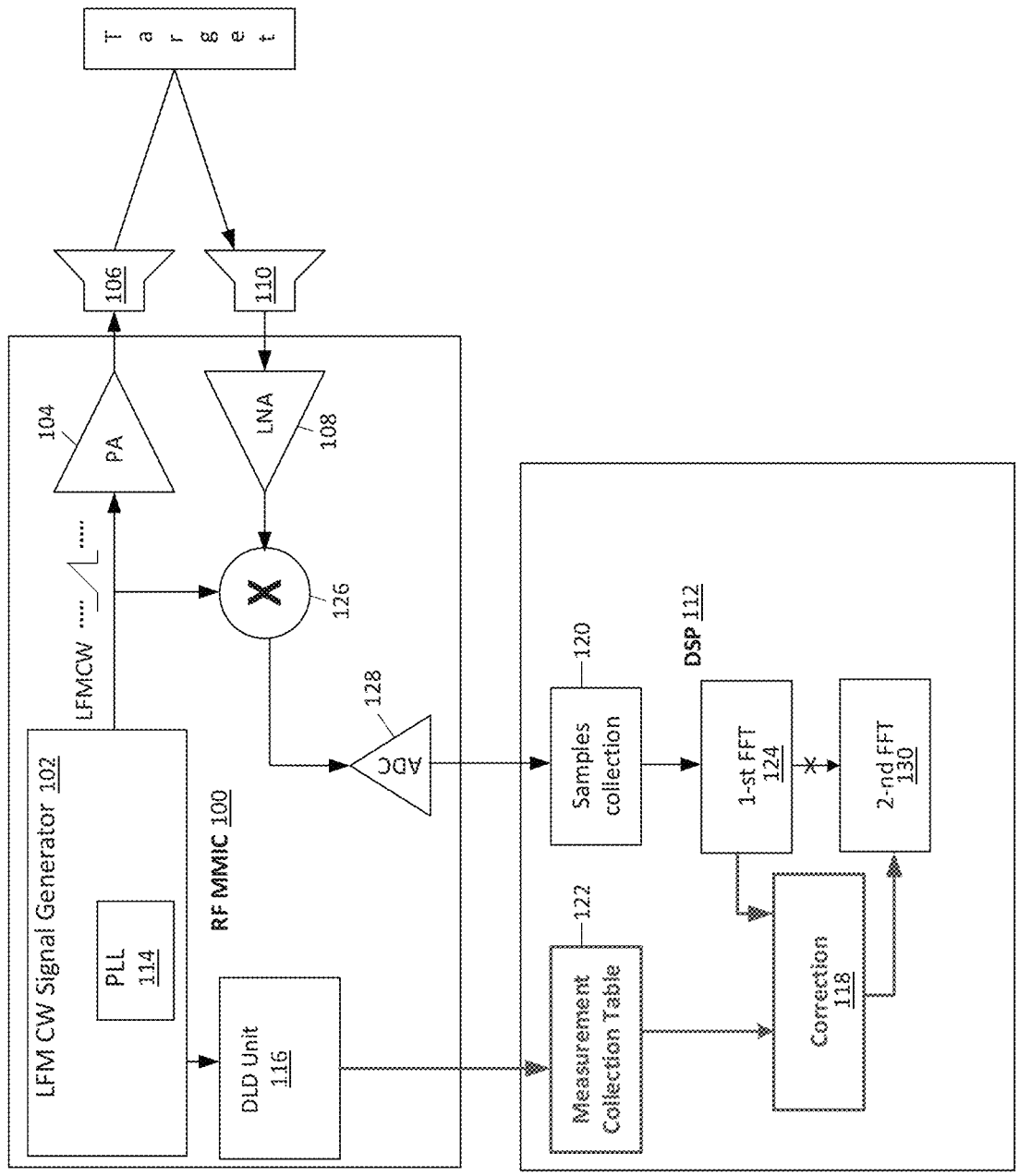
FIG. 1 illustrates a block diagram of an embodiment of a frequency-modulated continuous-wave (FMCW) radar system.

FIG. 1 illustrates an embodiment of a frequency-modulated continuous-wave (FMCVV) radar system. The radar system may be used in short-range applications (e.g. <80 m), medium-range applications (e.g. <150 m) or long-range applications (e.g. <300 m). The radar system includes an RF monolithic microwave integrated circuit (MMIC) 100 which includes a signal generator 102 for generating a linear FMCW signal, a power amplifier 104 for amplifying the linear FMCW signal for transmission over a transmit antenna 106, a receiver 108 such as a low noise amplifier (LNA) for receiving a return signal through a receive antenna 110. The radar system also includes a digital signal processor (DSP) 112 for processing received signals and controlling the signal generator 102 of the RF MMIC 100.

In one embodiment, the signal generator 102 includes a phase-locked loop (PLL) 114. The PLL 114 includes an oscillator such as an RF VCO and a multi-modulus divider (MMD) for implementing successive frequency modulation ramps of the oscillator output frequency, e.g., 100 or 200 ramps or more. The MMD is continuously ramped with different values so the oscillator output is linearly modulated. That is, generating a particular sequence for the MMD causes small oscillations in PLL frequency. Continuously applying different values to the MMD enables a frequency modulation ramp. Each frequency modulation ramp begins at a first frequency and ends at a second frequency.

Figure 2:
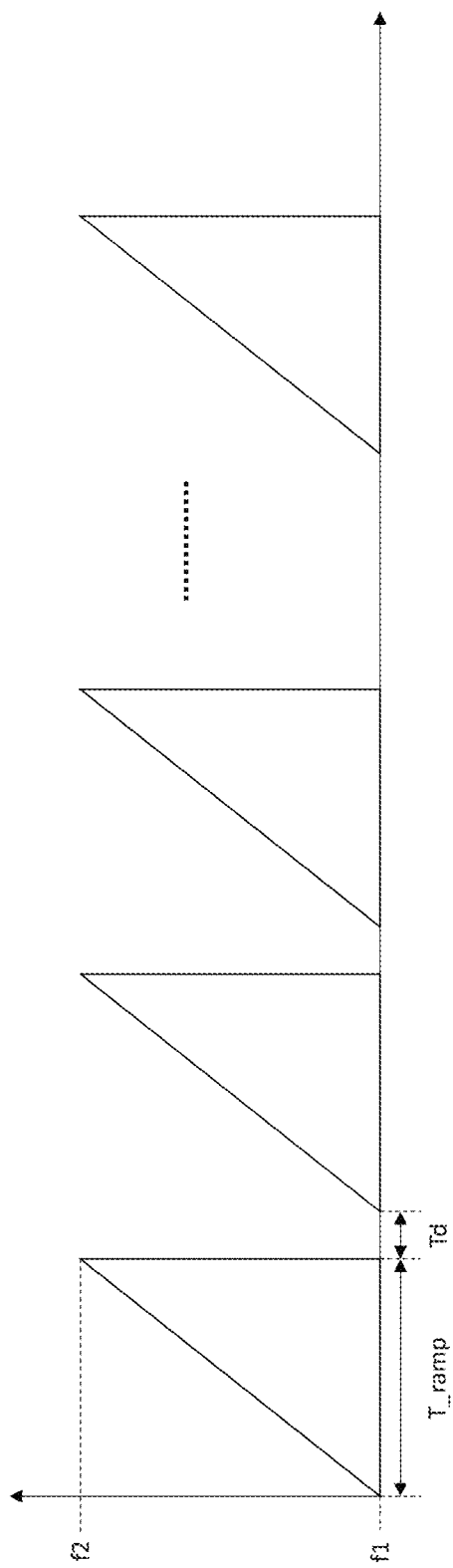
FIG. 2 illustrates an example of a linear FMCW signal generated by the radar system.

FIG. 2 shows an example of a linear FMCW signal (LFMCW) generated based on successive frequency modulation ramps generated by the signal generator 102, where each frequency modulation ramp begins at frequency f1 and ends at frequency f2. The duration (T_ramp) of each frequency modulation ramp may be in the μs (microsecond) range, e.g., 10 to 20 μs. The period (Td) between successive frequency modulation ramps is shorter than the ramp duration, e.g., 2 to 3 μs. Forming a frequency modulation ramp is thus a relatively slow process (e.g. 10 or 20 μs) compared to the flyback window during which the PPL frequency changes significantly before the start of the next frequency modulation ramp. For example, the difference between start frequency f1 and end frequency f2 may be 1 or 2 GHz. Therefore, PLL flyback tends to be a mostly unlocked process and only a short period of time is available to re-lock the PLL before starting the next frequency modulation ramp. When the PLL 114 is locked, the oscillator is synchronized to a periodic input signal. Non-linear effects dominate the behaviour of the PLL 114 in unlocked conditions.

To ensure efficient PLL locking after a flyback transition between the end frequency f2 of the previous frequency modulation ramp and the start frequency f1 of the next successive frequency modulation ramp, the signal generator 102 downmixes the MMD output to a frequency above zero Hertz, measures the downmixed output of the MMD to generate MMD output measurements for each frequency modulation ramp, and calculates the frequency of the MMD based on the MMD output measurements for each frequency modulation ramp. The calculated frequency may be used to ensure timely re-lock of the PLL at the start of a new frequency modulation ramp. The MMD output measurements may be used for additional purposes, e.g., to correct a signal received while the PLL is unlocked.

Figure 3:
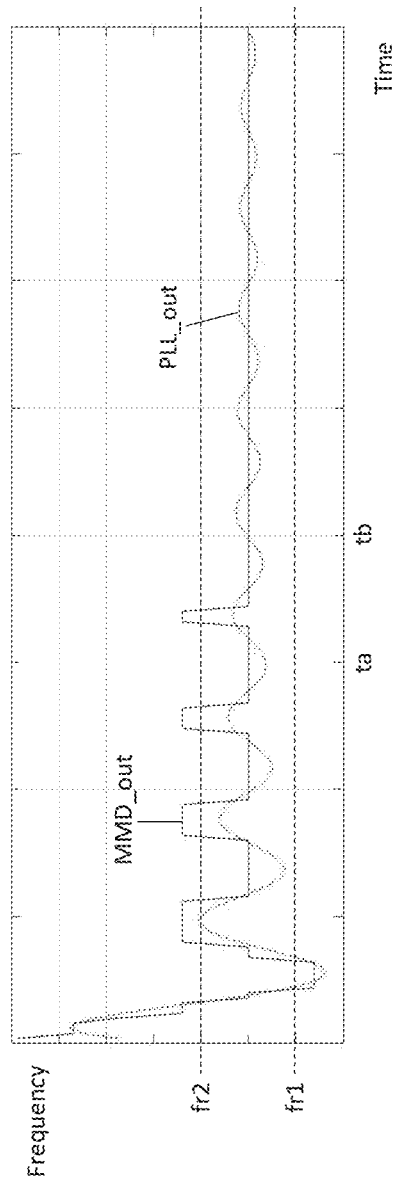
FIGS. 3 through 6 illustrate respective waveform diagrams of PLL output and multi-modulus divider (MMD) output during a frequency modulation ramp carried out by the radar system.

In one embodiment, a digital lock detection (DLD) unit 116 included in the RF MMIC 100 determines whether the PLL 114 is in a locked or unlocked condition based on the MMD output measurements for each frequency modulation ramp. For example, FIG. 3 illustrates the PLL output (PLL_out) and the MMD frequency measurement (MMD_out) during a frequency modulation ramp. The MMD frequency measurement follows the PLL output. The PLL output may have small oscillations, especially at the beginning of a new frequency modulation ramp, which are reflected as an error in the MMD output measurements. Hence, the PLL 114 may appear to be locked over time (average) but have oscillations. These oscillations are captured in the MMD output measurements, allowing the DLD unit 116 to continuously measure linearity over time. The DLD unit 116 may use the MMD output measurements to determine if the PLL 114 is in a locked or unlocked condition, and when the PLL 114 enters a locked condition during a frequency modulation ramp. The radar system may then decide how to handle the received data, and may use the MMD output measurements to correct received data.

In one embodiment, the DLD unit 116 determines that the PLL 114 is in a locked condition during a frequency modulation ramp if one or more of the MMD output measurements generated for the frequency modulation ramp have an amplitude corresponding to frequency deviation within a predetermined kilohertz frequency range defined by fr1 and fr2. In FIG. 3, the amplitude of the MMD output drops within the predetermined kilohertz frequency range defined by fr1 and fr2 between time instances ta and tb of the frequency modulation ramp, indicating that the PLL 114 has achieved lock. Prior to this point, the MMD output indicates the PLL 114 is in an unlocked condition since each MMD output measurement taken prior to time tb falls outside the predetermined kilohertz frequency range defined by fr1 and fr2.

Separately or in combination, the MMD output measurements may be collected and used by the DSP 112 to correct ramping nonlinearity. For example, the DSP 1121 may include a correction unit 118 for correcting a received signal based on the MMD output measurements. The correction unit 118 may correct the received signal based on the MMD output measurements directly after down-conversion in the analogue domain, and/or correct the received signal based on the MMD output measurements after sampling in the digital domain and/or after conversion to the frequency domain. In one embodiment, the correction unit 118 or other component of the DSP 112 uses individual measurement data from the DLD unit 116 to determine which data is valid. The DLD unit 116 provides a collection of samples as described above, and every sample may have a time stamp. The DSP 112 may store the collection of samples in memory 120. The correction unit 118 or other component of the DSP 112 may use a measurement table 122 of measurement results to identify which samples can be trusted, e.g., the samples in a linear condition. Based on the MMD data, the correction unit 118 or other component of the DSP 112 knows after each time unit (e.g. 1 or 2 us) whether the PLL 114 is a locked or unlocked condition and therefore knows when the corresponding received data can be trusted.

Figure 4:
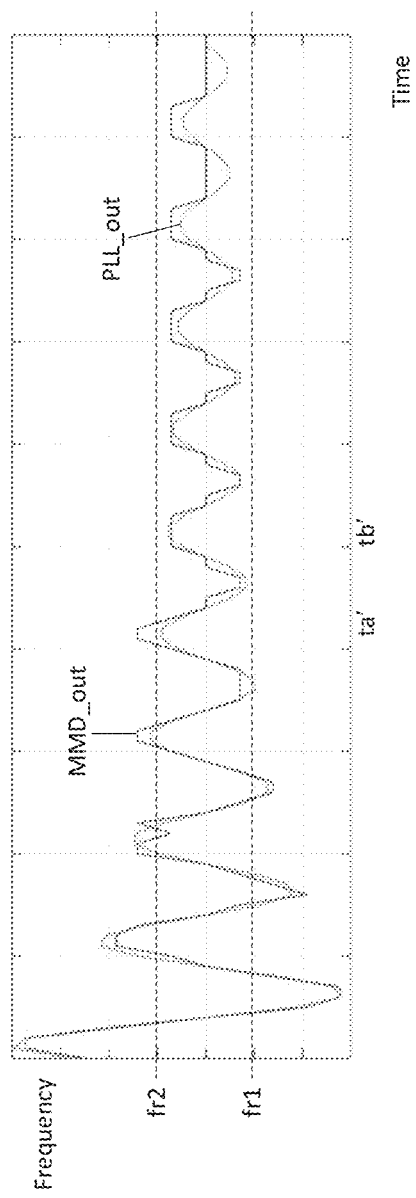

FIG. 4 illustrates another example of the PLL output (PLL_out) and the MMD frequency measurement (MMD_out) during a frequency modulation ramp. Different than the example shown in FIG. 3, the MMD output measurement error never reaches zero during the frequency modulation ramp meaning the PLL 114 has some oscillation over the entire ramp. However, between time instances ta' and tb' of the frequency modulation ramp, the MMD output still has some error but falls within the predetermined kilohertz frequency range defined by fr1 and fr2. Hence, the DLD unit 116 may determine that the PLL 114 is in a locked condition at time instance tb' even though the MMD output measurement still has some (acceptable) error.

Figure 5:
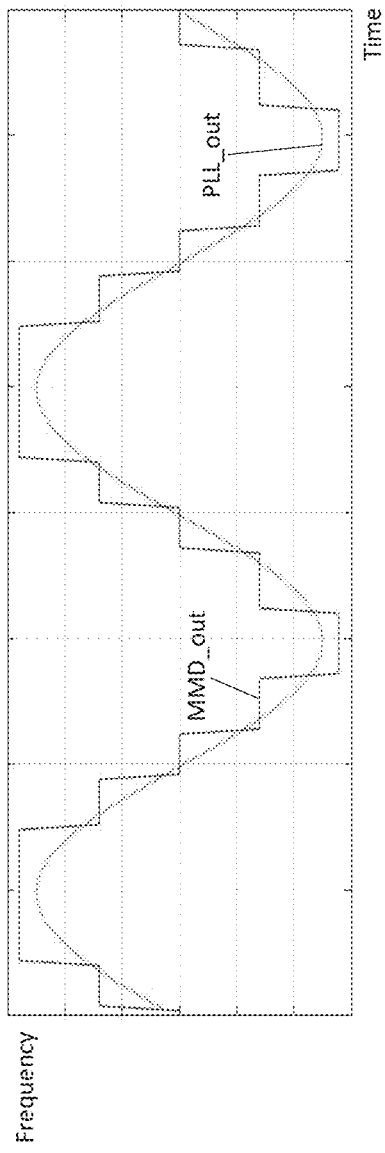
Figure 6:
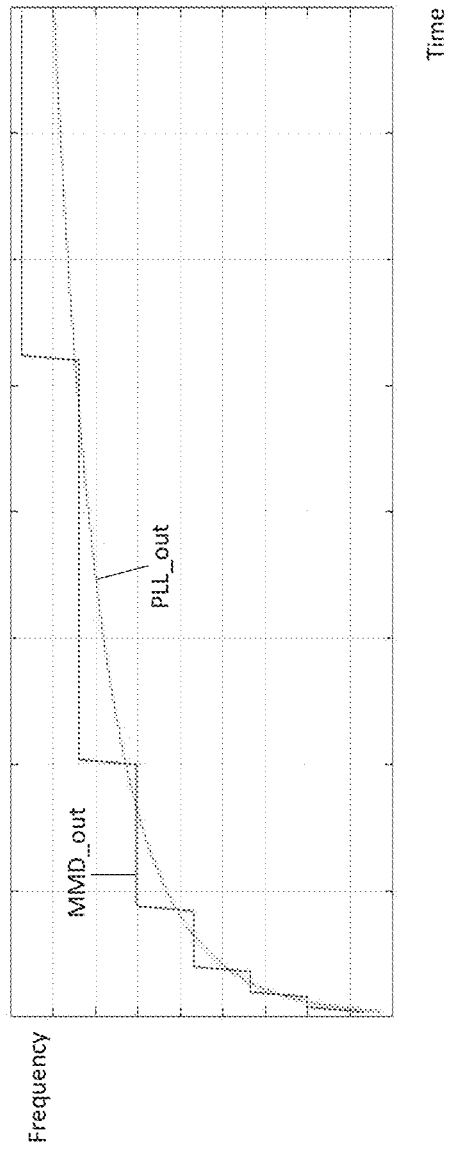

FIGS. 5 and 6 illustrate additional examples of the PLL output (PLL_out) and the MMD frequency measurement (MMD_out) during a frequency modulation ramp. In these examples, the PLL 114 does not lock during the frequency modulation ramp. The DLD unit 116 determines that the PLL 114 is in an unlocked condition based on the MMD output measurements provided by the signal generator 102. The DSP 116 may ignore received data during this time period or take one or more corrective actions such as attempting to correct the received data in the analogue or digital domain or after conversion to the frequency domain.

Figure 7:
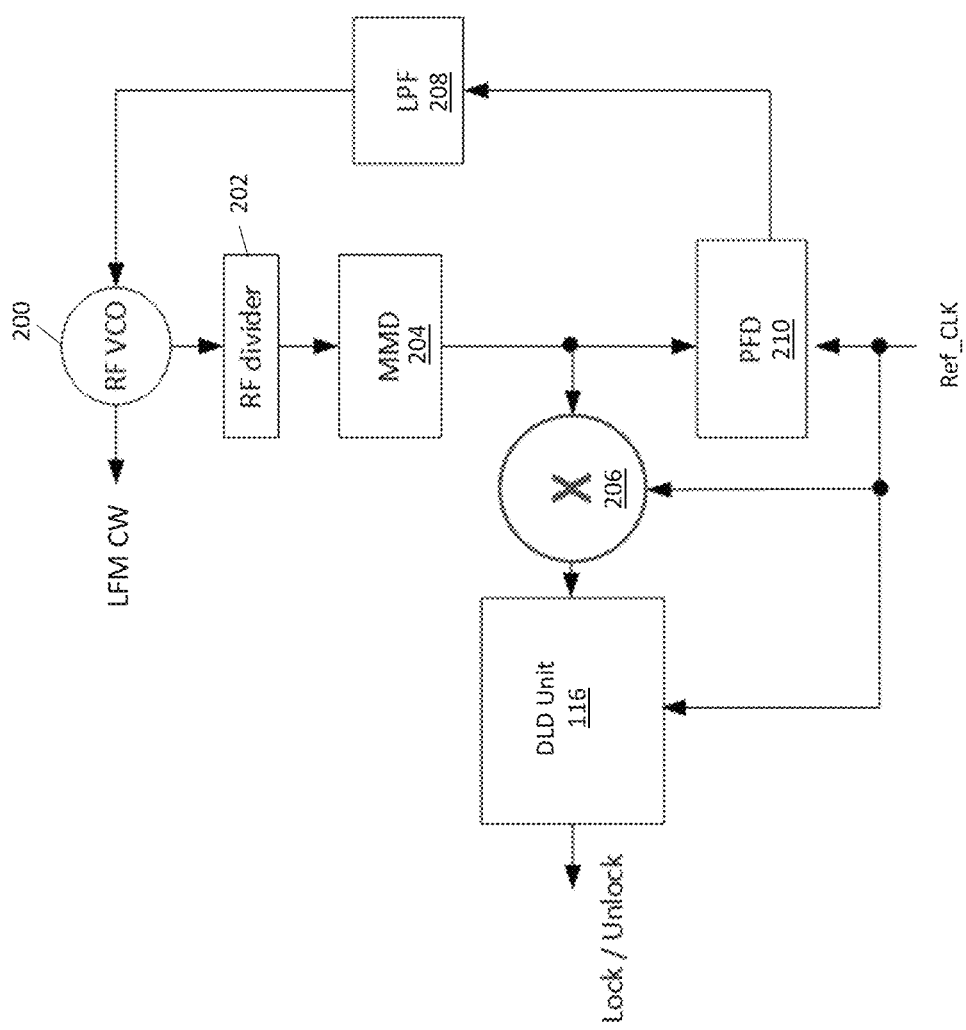
FIG. 7 illustrates a block diagram of an embodiment of a signal generator PLL of the radar system.

FIG. 7 illustrates an embodiment of the signal generator PLL 114 of the radar system. According to this embodiment, the PLL 114 includes an oscillator 200 such as an RF voltage-controlled oscillator (VCO) for setting the frequency of the linear FMCW signal (LFMCW). The PLL 114 also includes an RF divider 202 for diving-down the frequency of the oscillator, and a multi-modulus divider (MMD) 204 for implementing successive frequency modulation ramps of the divided-down oscillator frequency, each frequency modulation ramp beginning at a first frequency and ending at a second frequency. In one embodiment, the oscillator frequency is in the gigahertz range (e.g. 76 to 81 GHz) and the MMD output frequency is in the megahertz range (e.g. 200 to 400 MHz). A first down-mixer 206 downmixes the output of the MMD 204 to a frequency above zero hertz (e.g. 1 to 2 MHz). The output of the MMD 204 is downmixed with a reference clock signal (Ref_CLK) to achieve the down-mixing.

The DLD unit 116 measures the downmixed output of the MMD 204 to generate measurements for each frequency modulation ramp. The DLD unit 116 may indicate a locked/unlocked condition of the PLL 114 based on the MMD output measurements, e.g., as previously described herein. Since hundreds or even more MMD output measurements may be taken each frequency modulation ramp by using the downmixing technique described herein, the DLD unit 116 may determine a locked/unlocked condition of the PLL 114 with high precision. The PLL 114 further includes typical components such as a low pass filter (LPF) 208 and a phase-frequency detector (PFD) 210. The PFD 210 generates a voltage signal which represents the difference in phase between the reference clock signal Ref_CLK and the MMD output. The LPF 208 averages the PFD output over time.

The MMD output signal may be downmixed using any reference frequency. For example, a signal generator dedicated for generating the reference clock signal Ref_CLK may be included in the PLL 114 or elsewhere. To reduce complexity and cost of the PLL 114, the MMD output signal may be downmixed using any existing known frequency component within the PLL 114. In one embodiment, the PFD reference clock signal Ref_CLK is used for the down-mixing. Before the PLL 114 is locked, the low-frequency downmixed MMD signal (e.g. 1 to 20 MHz) may be readily measured. However, in a locked condition, the MMD output frequency equals or nearly equals the reference clock signal Ref_CLK and the resulting downmixed frequency becomes zero or near zero.

Figure 8:
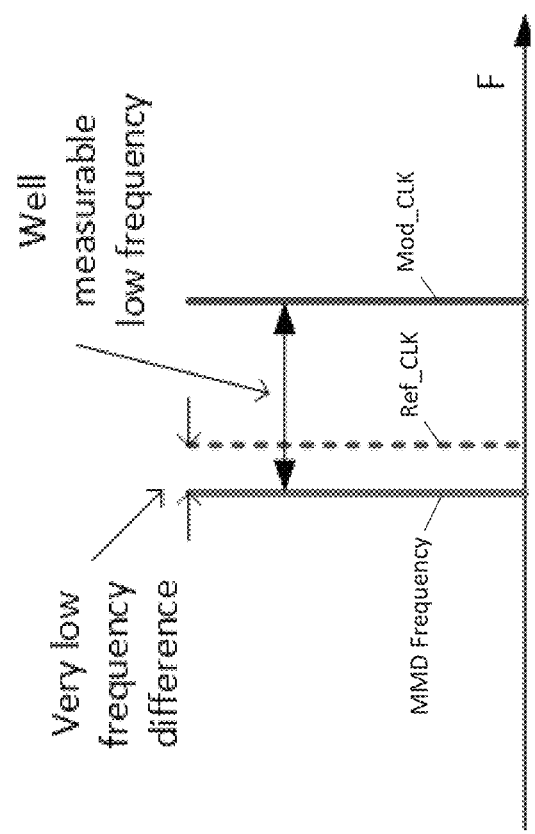
FIG. 8 illustrates an embodiment in which the radar system avoids zero downmixed frequency in the PLL locked condition, by modifying the reference frequency used for downmixing the MMD output.

FIG. 8 illustrates an embodiment in which zero downmixed frequency in a locked condition is avoided by modifying the reference frequency used for downmixing the MMD output. According to this embodiment, the reference frequency (Ref_CLK) is shifted up or down before downmixing of the MMD frequency. The frequency shifting may be implemented by dividing the PFD reference clock signal Ref_CLK by a known fixed or variable coefficient to yield a modified reference clock signal (Mod_CLK). To have the downmixed MMD frequency as low as possible but well measurable over a short time window, the modified reference clock signal Mod_CLK for MMD downmixing is preferably as close to the MMD frequency as possible.

Figure 9:
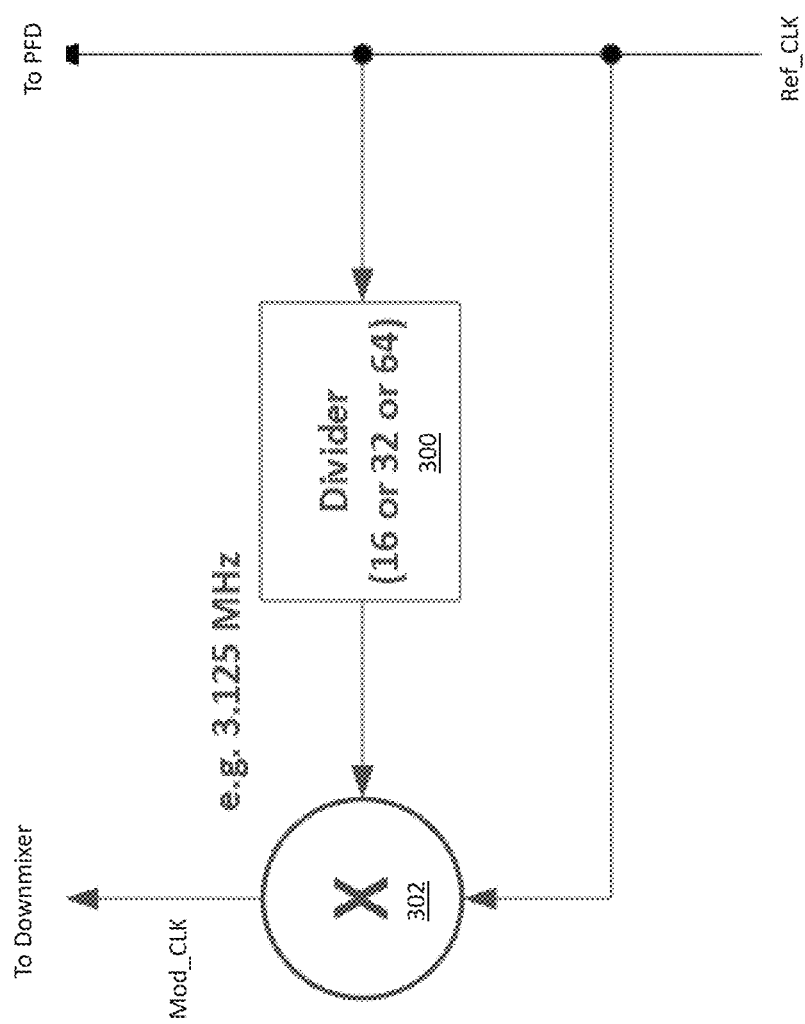
FIG. 9 illustrates a block diagram of an embodiment of a frequency shifter for shifting the frequency of the reference clock signal to generate the frequency at which the downmixed output of the MMD is measured by the radar system.

FIG. 9 illustrates an embodiment of a frequency shifter for shifting the frequency of the reference clock signal Ref_CLK to generate the frequency at which the output of the MMD 204 is downmixed. According to this embodiment, the frequency shifter includes a frequency divider 300 for dividing the reference clock signal Ref_CLK by a known fixed or variable coefficient (e.g. 16, 32, 64, etc.) to generate a divided reference clock signal (e.g. 3.125 MHz for a 200 MHz reference clock signal divided by 64). A mixer 302 mixes the original reference clock signal with the divided-down reference clock signal output by the frequency divider 300 to generate the modified reference clock signal Mod_CLK for MMD downmixing (e.g. 196.875 MHz for a 200 MHz reference clock signal divided by 64). In one embodiment, the frequency of the reference clock signal Ref_CLK is shifted by less than 5% to generate the frequency at which the output of the MMD 204 is downmixed. For example, the frequency of the reference clock signal Ref_CLK may be shifted by less than 2.5%. In one embodiment, the frequency of the downmixed output of the MMD 204 is less than 5 MHz when the PLL 114 is in a locked condition. For example, the frequency of the downmixed output of the MMD 204 may be less than 2.5 MHz when the PLL 114 is in a locked condition.

The reference signals used for downmixing may be digitally formed, and all mixing operations may be done using digital elements. To avoid filtering of wanted mixing components, single side band (SSB) mixing (converting) technology may be used. SSB mixers use SIN and COS components of both input signals.

Figure 10:
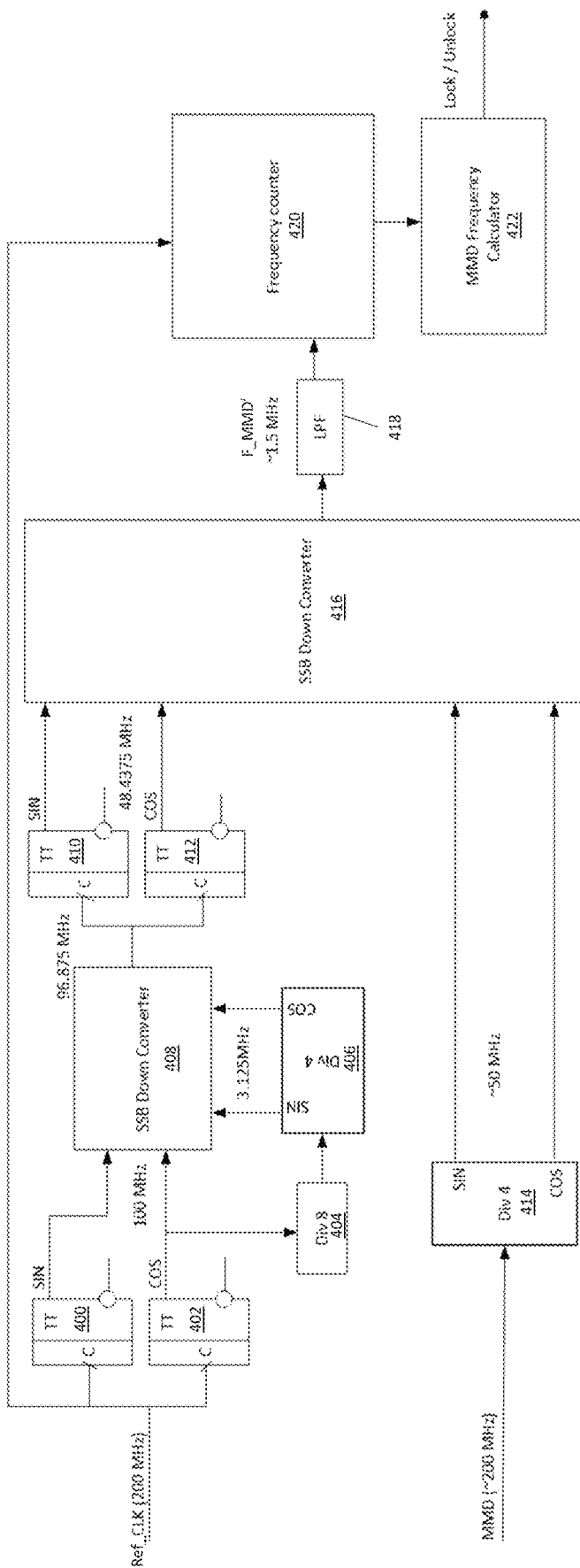
FIG. 10 illustrates a block diagram of an embodiment of a frequency shifter of the radar system.

FIG. 10 illustrates an embodiment of a frequency shifter implemented as a digital SSB mixer. Operation of the SSB mixer is described next based on an exemplary 200 MHz reference clock Ref_CLK and an exemplary MMD output signal at ~200 MHz. Other frequency combinations are possible. To generate SIN and COS components from the reference clock Ref_CLK, the reference clock Ref_CLK is first divided by 2 using flip-flops (TT) 400, 402 with positive and negative clocking edges. At the next stage, one component is divided by 8 by a first frequency divider 404 and then divided by 4 by a second frequency divider 406 to generate SIN and COS components of the divided-by-8 signal. The SIN and COS components of the divided-by-8 signal have a frequency of 3.125 MHZ in this example.

A first SSB downconverter 408 uses the SIN and COS components of the divided-by-8 signal to down convert the divided-by-2 SIN and COS components of the reference clock Ref_CLK. The down-converted signal has a frequency of 96.875 MHz in this example. The down-converted signal is then divided by 2 using flip-flops (TT) 410, 412 with different clocking edges. The resulting SIN and COS components have a frequency of 48.4375 MHz in this example. The MMD output signal is divided by 4 by a frequency divider 414 to generate SIN and COS components of the MMD output signal. The SIN and COS components of the MMD output signal have a frequency of ~50 MHz in this example.

A second SSB downconverter 416 downmixes the down-converted SIN and COS components of the reference clock Ref_CLK and the down-converted SIN and COS components of the MMD output signal. In this example, the second SSB downconverter 416 has an output frequency (F_MMD') of ~1.5 MHz when the PLL is in a locked condition. The output of the second downconverter 416 may be filtered, e.g. by a LPF 418. The embodiment shown in FIG. 10 thus uses two down mixers 408 to modify the reference frequency and the second SSB downconverter 416 for downmixing of the MMD output signal.

FIG. 10 also shows a frequency counter 420 and a calculation unit 422 included in or associated with the DLD unit 116. After each time unit (e.g. 1 µs, 2 µs, etc.), the frequency counter 420 in conjunction with the calculation unit 422 determine whether the PLL 114 is a locked or unlocked condition for each frequency modulation ramp of the oscillator output frequency. In one embodiment, the frequency counter 420 and the calculation unit 422 determine how many full periods of the low frequency signal output by the second downconverter 416 are inside a measurement window of interest and how many clock pulses of the reference signal (e.g. 200 MHz) are inside the measured number of full periods of the low frequency signal. The calculation unit 422 calculates the number of clock pulses based on the counter results and therefore calculates the frequency of the MMD 204. For example, if the ratio of clock pulses is within a predetermined range, the PLL 114 may be considered to be in a locked condition. The range may be in the kilohertz range, e.g. within 50 kHz. The length of the measurement window determines the size/complexity of the frequency counter 420 and the calculation unit 422. For a longer window, a more precise determination of the PLL locked/unlocked condition is provided, but more circuitry is needed. Hence, a trade-off can be made between PLL locked/unlocked precision and the circuitry/power used to make the PLL locked/unlocked determination.

With respect to the frequency examples illustrated in FIG. 10, the original reference clock frequency is 200 MHz and the modified reference clock frequency is 198 MHz. Measurements using both clocks may be used. In general, a low frequency downmixed MMD signal is measured with a much faster reference clock, yielding many MMD samples (e.g. hundreds) per frequency modulation ramp.

Figure 11:
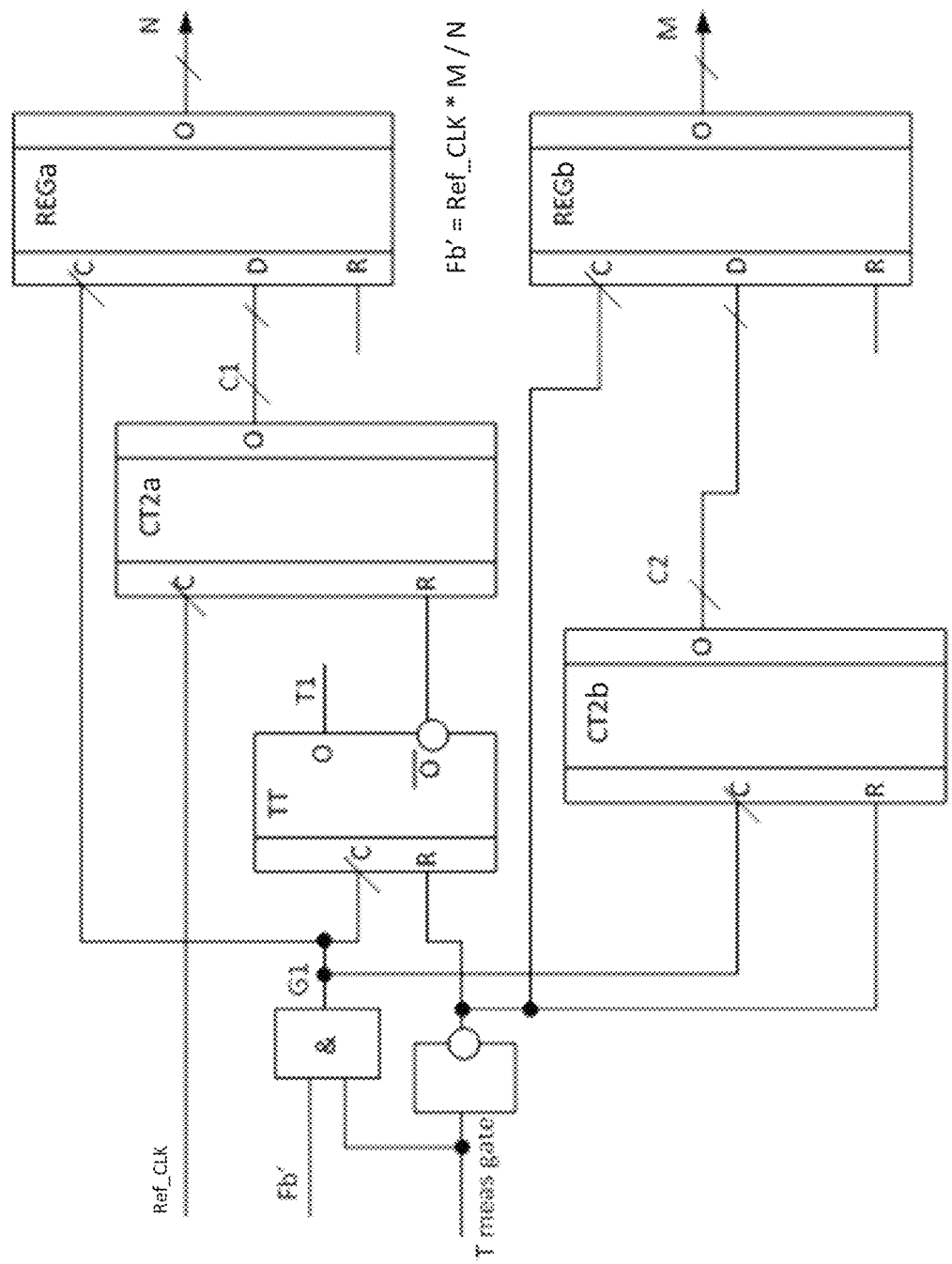
FIG. 11 illustrates a block diagram of an embodiment of a frequency counter of the radar system.

FIG. 11 illustrates an embodiment of the frequency counter 420 included in or associated with the DLD unit 116. Two counters CT2*a*, CT2*b* with respective outputs C1, C2 are used for frequency calculations. The first counter CT2*a* counts the number of reference signals (Ref_CLK). The second counter CT2*b* counts the number of full-period edges of the downmixed MMD signal (Fb') inside a given measurement window ('T meas gate'). Additionally, every edge of the downmixed MMD signal Fb' signal passing inside the measurement window stores the counter values of both counters CT2*a*, CT2*b* inside respective digital registers REGa, REGb so at the end of the measurement window there are two numbers N and M stored in the respective registers REGa, REGb. These numbers (N and M) may be used to calculate the frequency of the downmixed MMD signal Fb' as given by:

$$Fb'=\text{Ref\_CLK}*M/N \qquad (1)$$

In case one frequency (Fb') after downmixing is close to zero and cannot be measured, a second measured value Fb' may instead be used as described in more detail later herein in connection with FIG. 13. When two frequencies are measured, the lower one may be used for the final calculation or an average of two values may be used for better accuracy.

The DLD unit 116 of the radar system takes continuous measurements (e.g. of 1 µs steps, 2 µs steps, etc.), detects the rest of the settling process and delivers a PLL locked \ unlocked status for very fine criteria. The DLD unit 116 may measure MMD frequency with high precision in PLL locked and unlocked conditions, and may be used as a fast and precise DLD in different radar applications.

Figure 12:
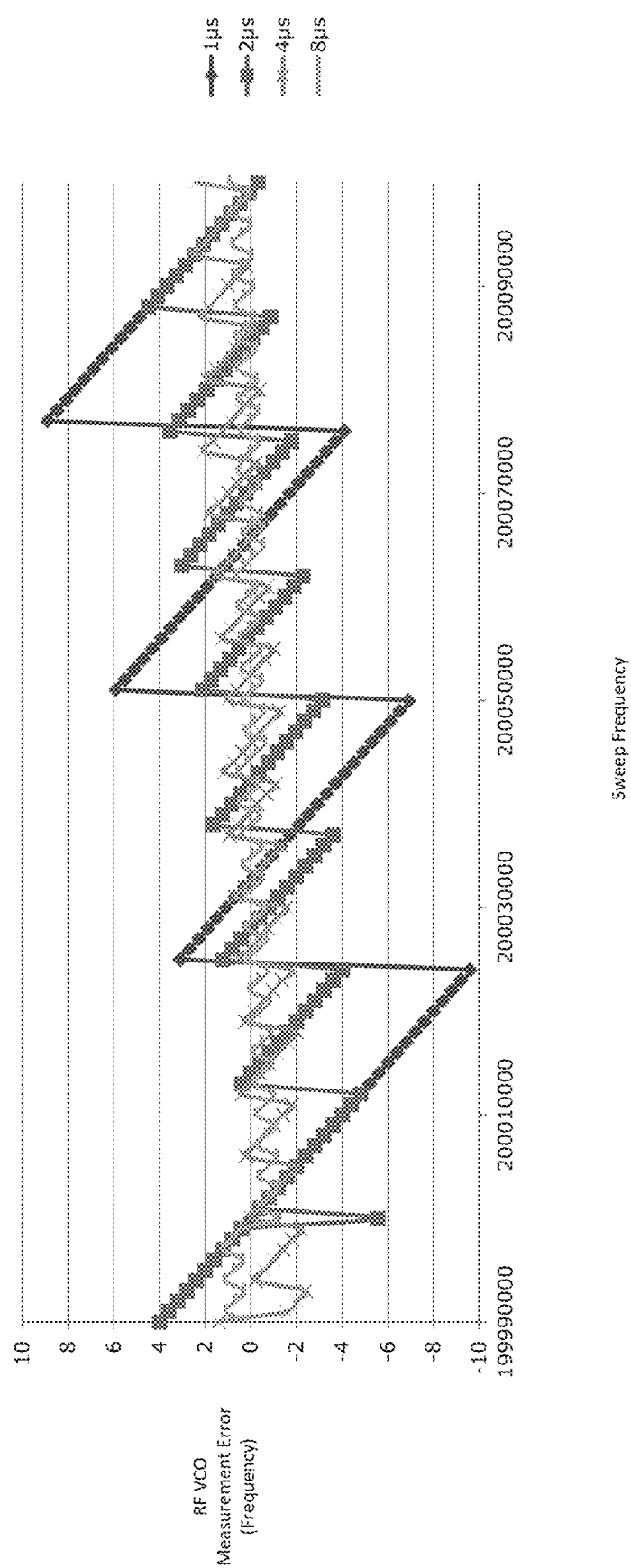
FIG. 12 illustrates simulated sweeps for the PLL of the radar system close to lock or locked conditions.

FIG. 12 shows simulated sweeps for the PLL 114 in a locked condition or close to a locked condition with the MMD frequency ranging from 199.9 to 200.1 MHz in 1 kHz steps. The simulated sweeps were done for different measurement time windows of 1 µs, 2 µs, 4 µs and 8 µs. The vertical axis represents frequency measurement error (in MHz) recalculated to an example VCO RF frequency of 80 GHz. Even for a 1 µs measurement time, the DLD unit 116 delivers measurement error inside +/−10 MHz at an RF VCO frequency of 80 GHz. A conventional system using the same 1 µs measurement time would have RF VCO measurement error of +/−400 MHz. Increasing the measurement time to e.g. 4 µs reduces the final error down to +/−2 MHz. Highly accurate PLL locked/unlocked conditions can be defined based on such precise measurement results, and precision versus measurement complexity trade-off can be made.

As shown in FIG. 8, the MMD frequency ('MMD Frequency') might be far away from the reference clock (Ref_CLK) before the PLL 114 is a locked condition and may not even fall between the modified reference clock signal (Mod_CLK) and the original reference clock Ref_CLK.

Figure 13:
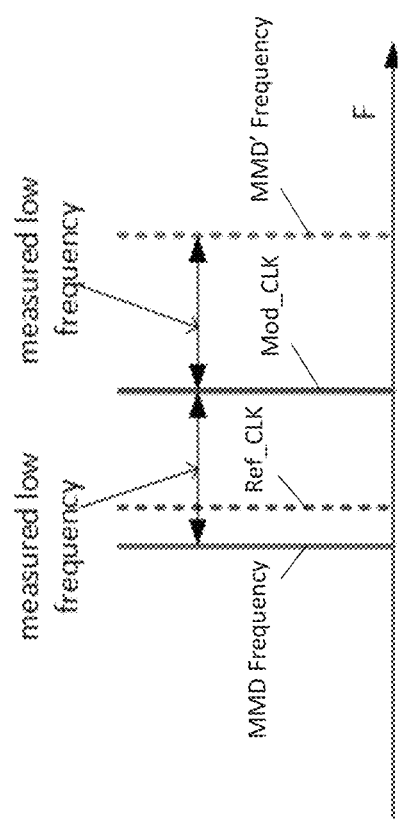
FIG. 13 illustrates the radar system under the same frequency conditions as in FIG. 8, but also with a modified MMD frequency.

FIG. 13 shows the radar system under the same frequency conditions, but also with a modified MMD frequency (MMD' Frequency). It may be the case that the MMD frequency (MMD Frequency) also may be below the modified MMD frequency (MMD' Frequency). In such a case, the measurement method may deliver a wrong result. In the case when the MMD frequency is very close to the modified reference clock, the measurement might not be possible because the frequency after downmixing will be close to zero.

Figure 14:
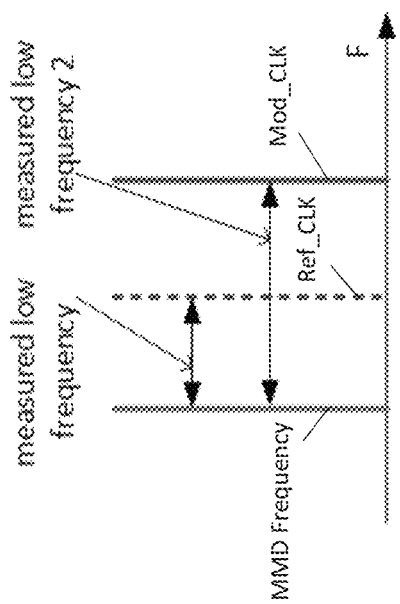
FIG. 14 illustrates an embodiment in which the low frequency measurement scenarios shown in FIG. 13 are avoided.
Figure 14:
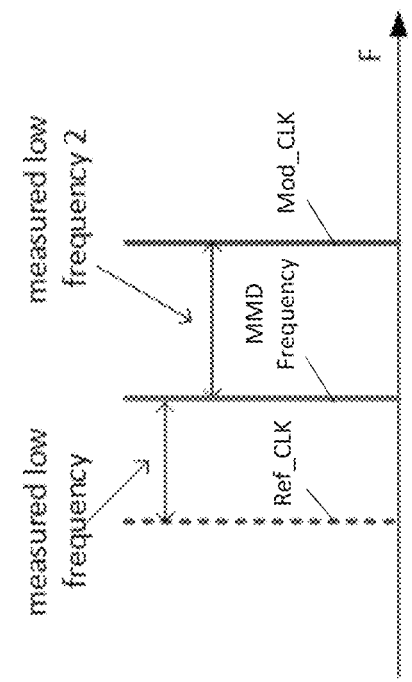

FIG. 14 illustrates an embodiment in which the scenarios described above in connection with FIG. 13 are avoided. The MMD frequency (MMD Frequency) is close to the modified reference clock signal (Mod_CLK), but the MMD frequency is further downmixed using the original reference frequency (Ref_CLK). According to this embodiment, at least one down mixed frequency ('measured low frequency' or 'measured low frequency 2') will be far from zero and well measurable. With two measured frequencies ('measured low frequency' and 'measured low frequency 2') after two down mixers, an accurate position of the original MMD frequency can be easily calculated even if the original MMD frequency is above (left-hand side of FIG. 14) or below (right-hand side of FIG. 14) the original reference frequency Ref_CLK.

Figure 15:
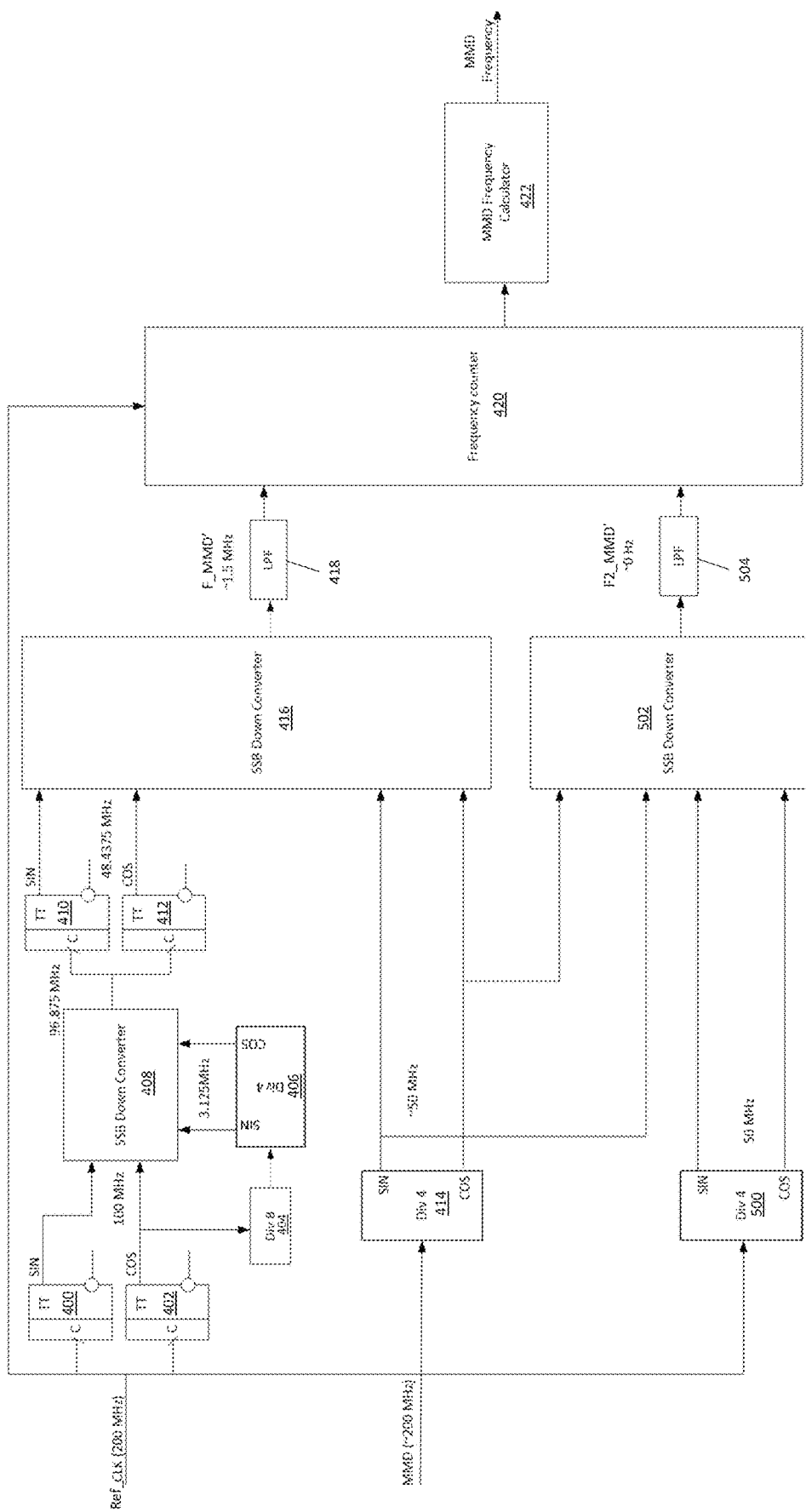
FIG. 15 illustrates a block diagram of another embodiment of a frequency shifter of the radar system.

FIG. 15 illustrates another embodiment of a digital SSB mixer used as a frequency shifter. The embodiment illustrated in FIG. 15 is similar to the embodiment illustrated in FIG. 10. Different, however, the reference clock signal (Ref_CLK) is divided by 4 by an additional frequency divider 500 to generate SIN and COS components from the reference clock Ref_CLK at 50 MHz in this example. An additional SSB mixer 502 downmixes the SIN and COS components of the reference clock signal Ref_CLK output by the additional frequency divider 500 with the SIN and COS components of the MMD output. In this example, the third SSB downconverter 502 has an output frequency (F2_MMD') of ~0MHz when the PLL 114 is in a locked condition. The output of the third downconverter 502 may be filtered, e.g. by a LPF 504. The embodiment shown in FIG. 15 thus uses three down mixers 408, 416, 502 with modified and original reference frequencies.

The DSP 112 may calculate the frequency of the MMD 204 based on measurement values taken at the output of at least one of the second and third SSB mixers 416, 502. For example, the DSP 112 may ignore the measurement values taken at the output of the second SSB mixer 416 if the frequency of the output of the second SSB mixer 416 is at or near zero or another threshold. The DSP 112 may instead ignore the measurement values taken at the output of the third SSB mixer 502 if the frequency of the output of the third SSB mixer 502 is at or near zero or another threshold. For the frequency examples shown in FIG. 15, the DSP 112 may calculate the frequency of the MMD 204 based on the measurement values taken at the output of the second SSB mixer 416 and ignore the measurement values taken at the output of the third SSB mixer 502.

After the DLD measurements are finished, the DSP 112 may calculate the MMD frequency using one or both sets of measured values. In case one frequency after down mixing is close to zero and cannot be measured, the DSP 112 may use the second measured value alone. When two frequencies are measured, the DSP 112 may use the lower one for final calculation or may calculate an average of the two values for better accuracy.

In addition to calculating the frequency of the MMD 204 and determining the locked/unlocked condition of the PLL 114, the information generated by the DLD unit 116 may be used by the DSP 112 to determine whether to trust data received by the radar system. For example, after a frequency modulation ramp, the DSP 112 may decide if the ramp was good (i.e. PLL lock was achieved) and whether the data received by the radar system during the ramp should be used. The received data for part of the ramp may be used by the DSP 112, e.g., if the DLD unit 116 indicates that the PLL 114 achieved a locked condition at some point in the ramp. The DSP 112 may try to correct measurement nonlinearity, e.g. based on known good received samples, in the time domain, in the frequency domain, etc.

Separately or in combination, nonlinearity in the frequency modulation ramp may cause variations in the intermediate frequency (IF) after down conversion. The radar system may erroneously identify such variations as potential targets (ghost targets) or multiple reflections instead of a single target. The DSP 112 may utilize a linearity profile of a currently executed frequency ramp to correct frequency errors which are detectable, e.g., after a first fast Fourier transform (FFT) 124.

The DLD unit 116 periodically measures ramping frequency over short intervals e.g. every 1-2 μs, as previously described herein. The DSP 112 may save the measured profile in a measurement collection table 122 during part or all of a single frequency modulation ramp. The data received by the radar system during the frequency modulation ramp may be downmixed by a first down-mixer 126, converted to the digital domain by an analogue-to-digital converter (ADC) 128 and stored by the DSP 112 in memory 120. After the frequency modulation ramp is finished and after completion of the first FFT 124 over the corresponding received data, the collected DLD measurement data stored in the measurement collection table 122 is used to correct results of the first FFT 124. The corrected data is then used by a second FFT 130, e.g., to create data such as a Range-Doppler map.

Figure 16:
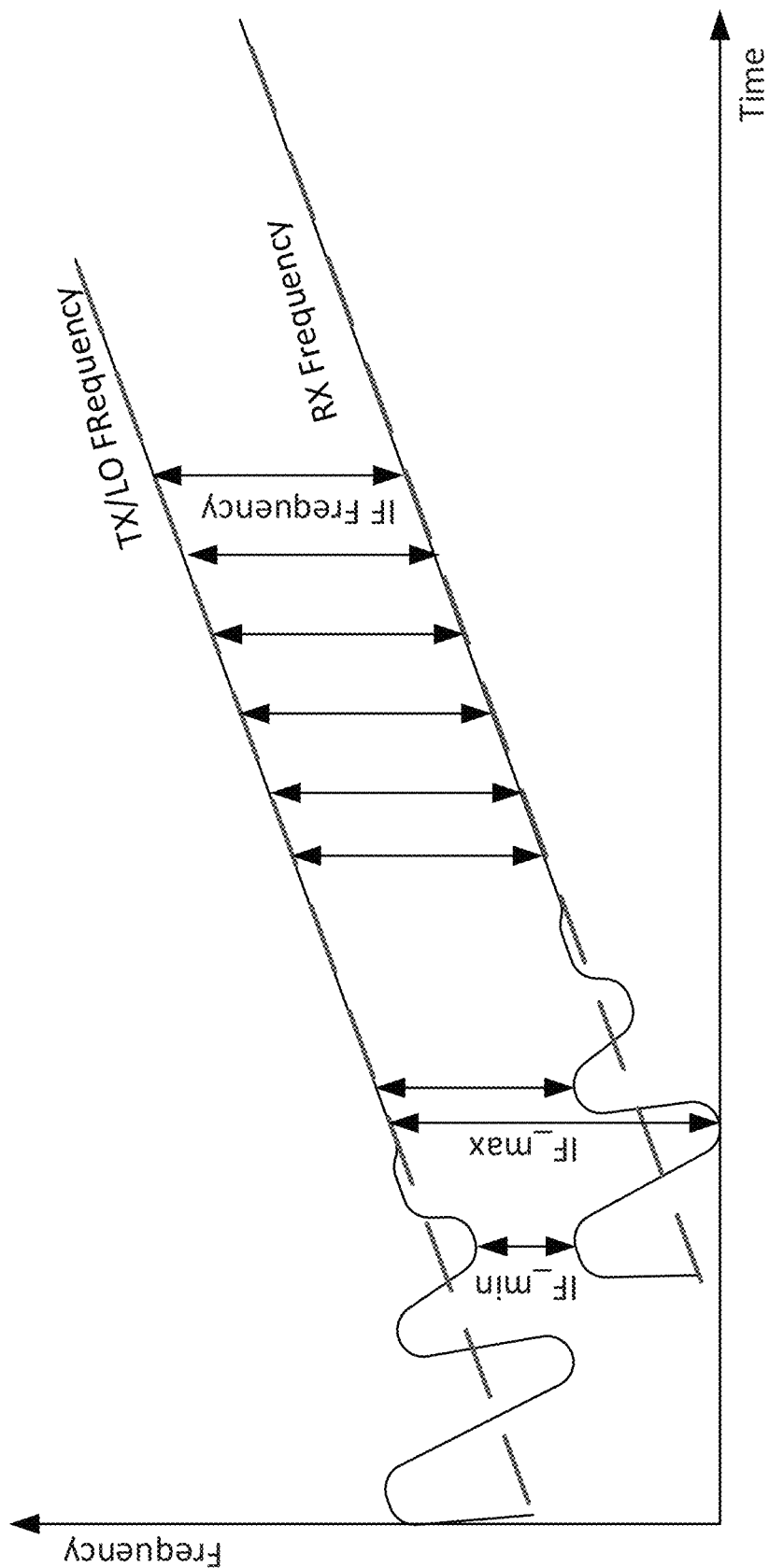
FIG. 16 illustrates waveform diagrams of the radar system transmit frequency, the radar system receive frequency and the resulting intermediate frequency over a frequency modulation ramp.

FIG. 16 illustrates the radar system transmit/VCO frequency (TX/LO Frequency), the radar system receive frequency (RX Frequency) and minimum (IF_min) and maximum (IF_max) points for the resulting intermediate frequency over a frequency modulation ramp. If the frequency of the linear FMCW signal is not linear changed, then variation in the intermediate frequency will be measured after receive down conversion. Frequency variations at the beginning of the frequency modulation ramp cause intermediate frequency variations visible as ghost targets in the IF representation. The PLL frequency is mostly nonlinear at the beginning of a frequency modulation ramp. After finishing, the PLL settling process ramping frequency rises or falls linearly for the remainder of the ramping time. After the first FFT 124, the accurate intermediate frequency component will have the highest level compared with parasitic components created because of ramp nonlinearity.

Figure 18:
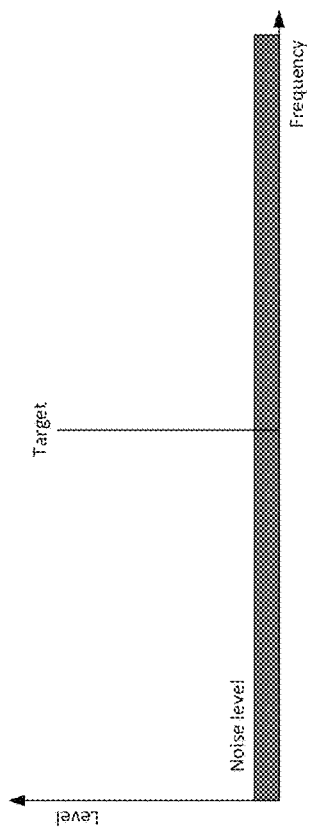
FIG. 18 illustrates a diagram of the intermediate frequency build after the first-order FFT and after nonlinearity correction.
Figure 17:
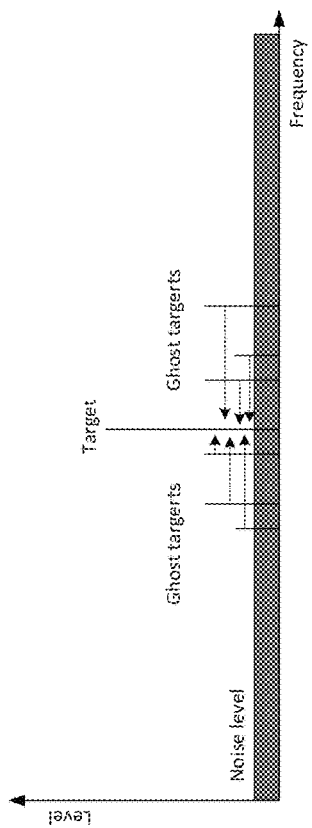
FIG. 17 illustrates a diagram of the intermediate frequency build after a first-order FFT, but before nonlinearity correction.

FIG. 17 illustrates the intermediate frequency build after the first FFT 124 but before nonlinearity correction, whereas FIG. 18 illustrates the intermediate frequency build after the first FFT 124 and after nonlinearity correction. After the first FFT 124, the DSP 112 examines every visible intermediate frequency component surrounded by additional components above a certain noise level for PLL nonlinearity effects. Beginning from the highest IF component level, the DSP 112 uses the frequency of the IF signal to calculate a time difference between the transmit (TX) and receive (RX) ramping signals, e.g. as given by:

$$T = IF\_freq / R\_slope \qquad (2)$$

where IF_freq is the intermediate frequency and R_slope is the slope of the frequency modulation ramp. Transmit and receive chains of the radar system use the same PLL 114, and therefore there have equal nonlinearity profiles for the radiated signal and for the local oscillator (LO) used for the RX down conversion. Using the ramping frequency profile measured by the DLD unit 116 and stored in the measurement correction table 122 and a copy of the ramping frequency profile shifted by time interval T, the DSP 112 may calculate the minimum and maximum intermediate frequencies generated because of the ramping nonlinearity.

Energy of all frequency components visible in the first FFT spectrum between the minimum and maximum intermediate frequencies above noise level may be added to the main IF component because all frequency components belong to the same target. The DSP 112 repeats the procedure explained above for all IF components beginning from the top and lying above a predefined threshold level. The DSP 112 uses the resulting corrected first FFT representation for the second FFT 130 to calculate data for Range-Doppler map.

The radar system described herein can measure MMD frequency with high precision in both locked and unlocked PLL conditions. The radar system may correct received data errors due to ramping nonlinearity in the analogue domain, in the digital domain, or in the frequency domain, e.g., between first and second FFTs 124, 130 to avoid ghost target detection and to increase the signal-to-noise ratio (SNR) of real targets.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of operating a phase-locked loop (PLL), the PLL including an oscillator configured to have an output frequency and a multi-modulus divider (MMD) configured to implement successive frequency modulation ramps of the oscillator output frequency, each frequency modulation ramp beginning at a first frequency and ending at a second frequency, the method comprising:
   downmixing an output of the MMD to a frequency above zero Hertz;
   measuring the downmixed output of the MMD to generate a plurality of MMD output measurements for each frequency modulation ramp; and
   calculating the frequency of the MMD based on the plurality of MMD output measurements for each frequency modulation ramp.

2. The method of claim 1, wherein the frequency at which the downmixed output of the MMD is measured is derived from a reference clock signal used to control a phase frequency detector of the PLL.

3. The method of claim 2, further comprising:
   shifting the frequency of the reference clock signal to generate the frequency at which the downmixed output of the MMD is measured.

4. The method of claim 3, wherein shifting the frequency of the reference clock signal to generate the frequency at which the downmixed output of the MMD is measured comprises:
   dividing the reference clock signal by a known fixed or variable coefficient to generate a divided reference clock signal; and
   mixing the reference clock signal with the divided reference clock signal.

5. The method of claim 2, wherein downmixing the output of the MMD comprises:
   downmixing SIN and COS components of the reference clock signal with SIN and COS components of the MMD output using a first single side band mixer.

6. The method of claim 5, further comprising:
   before the downmixing, shifting the frequency of the SIN and COS components of the reference clock signal using a second single side band mixer.

7. The method of claim 6, further comprising:
   downmixing the SIN and COS components of the reference clock signal with the SIN and COS components of the MMD output without additional shifting of the frequency of the SIN and COS components of the reference clock signal, using a third single side band mixer,
   wherein the frequency of the MMD is calculated based on measurement values taken at the output of at least one of the second and the third side band mixers.

8. The method of claim 7, further comprising:
   ignoring the measurement values taken at the output of the second side band mixer if the frequency of the output of the second side band mixer is at or near zero; and
   ignoring the measurement values taken at the output of the third side band mixer if the frequency of the output of the third side band mixer is at or near zero.

9. The method of claim 1, further comprising:
   determining whether the PLL is in a locked condition or an unlocked condition based on the plurality of MMD output measurements for each frequency modulation ramp.

10. The method of claim 9, wherein the PLL is determined to be in the locked condition during a frequency modulation ramp if one or more of the MMD output measurements generated for the frequency modulation ramp have a frequency within a predetermined frequency range.

11. The method of claim 1, further comprising:
   determining at which point of a frequency modulation ramp the PLL enters a locked condition based on the MMD output measurements.

12. The method of claim 1, further comprising:
   correcting ramp nonlinearity based on the MMD output measurements.

13. The method of claim 1, further comprising:
   correcting a received signal based on the MMD output measurements.

14. The method of claim 13, wherein the received signal is corrected based on the MMD output measurements directly after down-conversion in the analogue domain, after sampling in the digital domain, or after conversion to the frequency domain.

15. A phase-locked loop (PLL), comprising:
   an oscillator configured to have an output frequency;
   a multi-modulus divider (MMD) configured to implement successive frequency modulation ramps of the oscillator output frequency, each frequency modulation ramp beginning at a first frequency and ending at a second frequency;
   a first down-mixer configured to downmix an output of the MMD to a frequency above zero Hertz;
   a measurement unit configured to measure the downmixed output of the MMD to generate a plurality of MMD output measurements for each frequency modulation ramp; and
   a calculation unit configured to calculate the frequency of the MMD based on the plurality of MMD output measurements for each frequency modulation ramp.

16. The PLL of claim 15, wherein the frequency at which the downmixed output of the MMD is measured is derived from a reference clock signal used to control a phase frequency detector of the PLL.

17. The PLL of claim 16, further comprising:
a frequency shifter configured to shift the frequency of the reference clock signal to generate the frequency at which the downmixed output of the MMD is measured.

18. The PLL of claim 17, wherein the frequency shifter comprises:
a frequency divider configured to divide the reference clock signal by a known fixed or variable coefficient to generate a divided reference clock signal; and
a mixer configured to mix the reference clock signal with the divided reference clock signal.

19. The PLL of claim 17, wherein the frequency shifter comprises a first single side band mixer configured to downmix SIN and COS components of the reference clock signal with SIN and COS components of the MMD output.

20. The PLL of claim 19, wherein the frequency shifter further comprises a second single side band mixer configured to shift the frequency of the SIN and COS components of the reference clock signal before downmixing the SIN and COS components of the reference clock signal with the SIN and COS components of the MMD output.

21. The PLL of claim 15, further comprising a digital lock detection unit configured to determine whether the PLL is in a locked condition or an unlocked condition based on the plurality of MMD output measurements for each frequency modulation ramp.

22. The PLL of claim 21, wherein the digital lock detection unit is further configured to determine at which point of a frequency modulation ramp the PLL enters a locked condition based on the MMD output measurements.

23. The PLL of claim 21, wherein the digital lock detection unit is further configured to correct ramp nonlinearity based on the MMD output measurements.

24. The PLL of claim 15, further comprising a correction unit configured to correct a received signal based on the MMD output measurements.

25. A radar system, comprising:
a signal generator configured to generate a frequency-modulated continuous-wave signal;
a power amplifier configured to amplify the frequency-modulated continuous-wave signal for transmission;
a receiver configured to receive a return signal; and
a digital signal processor configured to process the received signal and control the signal generator,
wherein the signal generator comprises a phase-locked loop (PLL) which includes:
an oscillator configured to set the frequency of the frequency-modulated continuous-wave signal;
a multi-modulus divider (MMD) configured to implement successive frequency modulation ramps of the oscillator frequency, each frequency modulation ramp beginning at a first frequency and ending at a second frequency;
a first down-mixer configured to downmix an output of the MMD to a frequency above zero Hertz;
a measurement unit configured to measure the downmixed output of the MMD to generate a plurality of MMD output measurements for each frequency modulation ramp; and
a calculation unit configured to calculate the frequency of the MMD based on the plurality of MMD output measurements for each frequency modulation ramp.

* * * * *